US005703021A

United States Patent [19]
von Schnering et al.

[11] Patent Number: 5,703,021
[45] Date of Patent: Dec. 30, 1997

[54] PROCESS FOR MAKING HIGH TEMPERATURE BI-SR-CA-CU OXIDE SUPERCONDUCTOR

[75] Inventors: Hans-Georg von Schnering, Aidlingen; Winfried Becker, Kelkheim; Martin Schwarz, Königstein/Taunus; Bernhard Hettich, Hofheim am Taunus; Martin Hartweg, Stuttgart; Leonhard Walz, Rastatt; Thomas Popp, Leonberg, all of Germany

[73] Assignee: Hoechst Aktiengesellschaft, Germany

[21] Appl. No.: 475,078

[22] Filed: Jun. 7, 1995

Related U.S. Application Data

[62] Division of Ser. No. 133,557, Oct. 7, 1993, which is a continuation of Ser. No. 525,547, May 18, 1990, abandoned, which is a continuation of Ser. No. 305,854, Feb. 2, 1989, abandoned.

[30] Foreign Application Priority Data

| Feb. 5, 1988 | [DE] | Germany | P 38 03 530.8 |
| Feb. 29, 1988 | [DE] | Germany | P 38 06 417.0 |
| Feb. 29, 1988 | [DE] | Germany | P 38 06 530.4 |
| Mar. 1, 1988 | [DE] | Germany | P 38 06 531.2 |

[51] Int. Cl.$^6$ ............... H01B 12/00; C04B 35/626; C04B 35/64
[52] U.S. Cl. ............... 505/501; 505/440; 505/441; 505/737; 505/742; 505/782; 252/521
[58] Field of Search ............... 505/121, 125, 505/440, 441, 501, 737, 742, 782; 252/518, 521

[56] References Cited

U.S. PATENT DOCUMENTS

| 3,743,691 | 7/1973 | Trew | 423/432 |
| 4,880,771 | 11/1989 | Cava et al. | 505/1 |
| 5,340,796 | 8/1994 | Cava et al. | 505/782 |

OTHER PUBLICATIONS

C. Michel et al, Z. Phys. B., 68, 421 (1987) Jul.
S. Jin et al., Appl. Phys. Letters, 51, 21 (1987) Sep.
Maeda, H. et al, "A New High T$_c$ Oxide Superconductor Without Rare Earth Element", Preprint rec'd. Jan. 25, 1988, 9 pp.
Maeda, H. et al, Japan J. Appl. Phys., vol. 27, No. 2, Feb. 26, 1988, pp. L209–L210.
Subramanian, M. A. et al, Science, vol. 239, Feb. 26, 1988, pp. 1015–1017.
*Superconductor Week*, vol. 2, No. 6, p. 1 Feb. 8, 1988.
Japanese Economic News Articles, published Jan. 22, 1988, In Japanese with English translations: "High-temerapture Superconductivity without Rare Earths –First to have absolute temperature of 105°K" and New Superconductor from National Research Institute for Metals.
Yomiuri Shinbun, "New Superconducing Material Discovered", published Jan. 22, 1988, in Japanese with English translation.
Mainichi Sinbun, "New Type of High–Temperature Superconducting Material Discovered", Jan. 22, 1988, in Japanese with English translation.
Asahi Shinbun, "Inexpensive and Stable Superconducting Material developed", Jan. 22, 1988, in Japanese with English translation.
The "Press Report Transcript", New High Temperature Oxide Superconductor Has Been Found That Has Excellent Characteristics and Does not Contain Any Rare Earth Element, Jan. 21, 1988, in Japanese with English translation.
"Superconductor Week", vol. 2, No. 5, Feb. 1, 1988, High T. Materials Without Rare Earths Found in Japan, U.S.
Jun Akimitsu et al., "Superconductivity in the Bi–Sr–Cu–O System", JPN. J. App. Phys., vol. 26, No. 12, Dec. 1987 p. L2080.
Proceedings of the International conference on High Temperature Superconductors and Materials and Mechanisms of Superconductivity, Interlaken, Switzerland, Feb. 28 –Mar. 4, 1988.
Maeda et al., "New High–T. Superconductors without Rare Earth Element", Physics C–153–155 (1988), 602–607, published Feb. 28,–Mar. 4, 1988.
Politis, Proc. IX Winter Meeting Low Temp. Phys., Cuernervaca, Mex. Jan. 15, 1988.
Kirk–Othmer Encyc. of Chem. Technol., 3rd ed., 21, 1983 (pp. 762–769).
Dugani, R., "New Class of Superconductors Discovered", C&E News, 66:5 (Feb. 1, 1988).
Majewsky et al, Adv. Mater. 3, 488–491 [1991].
Tarascon et al, Phys. Rev. B 38, 2504–2508 [1988]Aug.
Tarascon et al, Phys. Rev. B. 38, 8885–8892 [1988]Nov.
Dugani, R., "New Class of Superconductors Discovered", C&E News, 66:5 (Feb. 1, 1988).
Nikkei Chodendo, Feb. 22, 1988, pp. 1–4, translated.
Nikkei Sangyo Shinbun, Feb. 25, 1988, p. 3, translated.
Nikkei Chodendo, Feb. 22, 1988, pp. 1–4, translated.
Nikkei Chodendo, Jan. 25, 1988, p. 1, translated.
Nikkei Chodendo, Feb. 8, 1988, pp. 1–2, translated.
Japanese Journal of applied Physics, vol. 27, No. 3, pp. L344–L346, Mar. 28, 1988.
*Nikkan Kogyo Shinbun* –translations of items appearing on Feb. 4, Feb. 8, Feb. 13, Feb. 25, and Feb. 22, 1988.

*Primary Examiner*—Paul Lieberman
*Assistant Examiner*—M. Kopec
*Attorney, Agent, or Firm*—Connolly & Hutz

[57] ABSTRACT

A description is given of superconducting substances having a content of Bi, Sr, Ca and Cu, and of processes for their preparation from the metal oxides within a range which is specified by the overall composition $Bi_a(Sr,Ca)_b\text{-}Cu_6O_x$, where a=3–24 and b=3.23–24, with an Sr/Ca atomic ratio of 1:9–9:1 and a Bi:(Ca+Sr) atomic ratio of 0.3–1.5. The transition temperature is at least 60 K. The principal phase crystallizes in the orthorhombic system. The pure compounds $Bi_4(Sr,Ca)_4Cu_2O_{\approx 12}$ and $Bi_4(Sr,Ca)_6Cu_4O_{\approx 20}$.

18 Claims, No Drawings

PROCESS FOR MAKING HIGH TEMPERATURE BI-SR-CA-CU OXIDE SUPERCONDUCTOR

This is a division of application Ser. No. 08/133,557, Oct. 7, 1993, which is a continuation of Ser. No. 07/525,547, filed May 18, 1990, ABN, which is a continuation of application Ser. No. 07/305,854, filed Feb. 2, 1989, now abandoned.

The present invention relates to high-temperature superconducting substances based on bismuth, strontium, calcium and copper.

While it was possible to use the conventional superconducting materials solely at very low temperatures which required the use of the very expensive coolant helium, the new superconducting oxidic substances operate at substantially higher temperatures which can be achieved with the comparatively cheap coolant nitrogen. This reduces the running costs of superconducting appliances and systems and opens up novel extensive application possibilities.

A substantial disadvantage of many novel oxidic superconductors is however that they contain, as a common component, La or Y or rare earth metals such as, for example, Sm, Lu, Ho or Eu. Some of these metals occur only in small quantities and are expensive owing to their complicated extraction. Disadvantages stemming from the high raw material prices and the limited reserves of the rare earth metals consequently arise for the production of large quantities of oxidic superconductors.

An oxidic superconductor having a transition temperature of 20 K is already known which contains in oxidic form the elements bismuth, strontium and copper in an atomic ratio of 1:1:1. (C. Michel et al., Z. Phys. B 68 (1987) 421). A transition temperature of about 20 K is, however, still not satisfactory for industrial purposes.

There was therefore the object of providing novel superconducting oxidic substances which do not contain any rare earth metals and do not contain lanthanum or yttrium and whose transition temperature is markedly above 20 K.

The invention is based on the discovery that the transition temperature in the system comprising the oxides of Bi, Sr, Ca and Cu is favorably influenced if calcium is also present in addition to strontium and a Bi:(Sr+Ca) atomic ratio of about 0.3–2.2, in particular 0.5–2.2, preferably 0.3–1.5 in the initial mixture of metal oxides is maintained. Particularly preferred is ratio 0.3–1.3.

Novel substances with superconductivity have now been found which contain the metal strontium, calcium, copper and bismuth in oxidic form. These are black crystalline substances with the overall composition $Bi_a(Sr,Ca)_bCu_6O_x$, where a=1.8–24, preferably 3–24
b=3.23–24 and
x=about 1.5a+b+6 with a Ca/Sr atomic ratio of 9:1–1:9, in particular 9:1–1:3, preferably 3:1–1:3.

The substances have a critical temperature (transition temperature) $T_c$ of at least 60 K and preferably of at least 70 K. They are black and their principal phases crystallize in the orthorhombic system.

Preferred are mixtures with a Bi/Cu atomic ratio of 0.5–2 (ie. a=3–12) and a (Ca+Sr):Cu atomic ratio of 1–2 (ie. b=6–12) and a Bi:(Ca+Sr) atomic ratio of 0.3–2, preferably 0.3–1.3, in particular 0.5–1.

In the substances, the oxygen content found to be somewhat higher than calculated for divalent copper and trivalent bismuth. They therefore probably contain also $Cu^{+++}$ ions or $Bi^{4+}/Bi^{5+}$ ions. For a given a, b and c, an oxygen content (x) which is as high as possible is advantageous for the superconductivity.

In a particular embodiment of the invention, the (Ca+Sr+Cu):Bi atomic ratio in the black crystalline substances is about 1.5.

These substances have the general composition $Bi_2(Ca,Sr)_yCu_{3-y+k}O_f$ where k denotes a number between −0.05 and +0.05, preferably 0 and y denotes a number between 1 and 2.5, preferably 1.33 to 2.25, in particular 1.33 to 2.1, and f denotes about 6+k.

Here the range y=1.9–2.1 is particularly preferred.

A black crystalline substance furthermore behaves advantageously which has the overall composition $Bi_a(Sr,Ca)_bCu_6O_x$, where a=3–24 and
b=3.23 to 24, with a Sr/Ca atomic ratio of 1:9 to 9:1, a Bi:(Sr+Ca) atomic ratio of 0.45 to 1.5, preferably 0.5–1, a transition temperature $T_c$ for the superconductivity of at least 60 K and a principal phase which crystallizes in the orthorhombic system. This also applies to mixtures in which 12<a≦24 and b=3.23–24 or a=3–24 and 3.23≦b<6 or 12<b≦24.

Preferred here are crystalline substances of the overall sonposition $Bi_a(Sr,Ca)_bCu_6O_x$ in which a=3–14 and b=4 to 18, in particular 4.9 to 14.
Particularly preferred are mixtures in which a=4 to 14 and
b=6 to 14, with a Bi:(Sr+Ca) atomic ratio of 0.45–1.13, in particular 0.5–1.13.

The index for the proportion of oxygen is about x=1.5a+b+6. It is somewhat dependent on the annealing conditions. For high thermal post treatment temperatures, x is less than for low ones. Oxygen can probably be reversibly taken up at particular lattice sites.

Provided the black crystalline substance has an overall composition in the range $Bi_a(Sr,Ca)_bCu_6O_x$, where a=9.8 to 14 and
b=9.8 to 14 and the Bi:(Sr+Ca) atomic ratio is 0.89 to 1.13, it contains as the principal component the superconducting phase of the composition $Bi_4(Sr,Ca)_4Cu_2O_x$, further details on the preparation of which are to be found on page 7. In these mixtures too, the Ca:Sr atomic ratio is 9:1–1:9, in particular 3:1–1:3.

The novel substances can be prepared by mixing oxides or oxide precursors of the elements Bi, Sr, Ca and Cu thoroughly and heating the mixture to temperatures of at least 700° C.

During the reaction, the atomic ratio of the metals used does not change in a first approximation. The atomic ratio used therefore corresponds to the required oxide composition.

As oxide precursors, use may generally be made of compounds which react to form the corresponding oxides at the reaction temperature, in particular the hydroxides and nitrates. The acetates, formates, oxalates and carbonates of the said metals may also be used. For example, calcium oxide, strontium carbonate, bismuthic acid, bismuth(III) oxide, bismuth(V) oxide, $Cu_2O$ and $CuO$ may be used.

The reaction mixture does not have to, or only partially has to, melt. In this case, it is, however, necessary to keep it for a prolonged period at the reaction temperature.

The synthesis temperature is in this case preferably in the range between 700° and 900° C., preferably 750°–850° C.

The reaction time should be at least 4 hours, still better, at least 8 hours. The reaction time is limited in the upward direction only by economic considerations. Reaction times of 100 or 120 hours are possible.

The mixture may also be heated so high that it is melted completely. In this case, cooling can be carried out rapidly to temperatures below the solidification point of the entire mixture, ie. 300°–900° C., preferably 300°–830° C., and the mixture may be kept in this range for a prolonged time (at least one hour, preferably 4 hours).

Advantageously, the melt can be deposited on a substrate and allowed to solidify there. In this manner, compact layers of the superconductor are obtained on a base after the subsequent temperature treatment at 300°–900° C. The substrate (base) should not react with the reaction mixture. Suitable as a material for the substrate are, for example, $Al_2O_3$, $SiO_2$ (quartz), $ZrO_2$, strontium titanate and barium titanate, and also metals such as steel and Cr/Ni alloys. In this manner, for example, fairly thin layers of 1 µm–5 mm can be prepared.

The melt may also be spun. In this case, filaments or threads are produced which are also superconducting after annealing at 300°–900° C., preferably 300°–830° C.

The actual reaction should take place in a non-reducing atmosphere. Use may be made, for example, of air, pure oxygen, mixtures of $O_2/Ar$ or $O_2/N_2$. It is preferable if the reaction of the oxides is carried out in an atmosphere containing oxygen.

After the reaction is complete, the sample is either removed from the furnace and slowly cooled to room temperature in air or oxygen, or is slowly cooled to room temperature in the furnace. Low cooling rates (not exceeding 100 K/h) have a favorable effect on the superconducting properties of the reaction product.

To make sure that the entire oxide mixture has reacted, it is advantageous to comminute the powder obtained further after cooling and to treat it again thermally. For this post treatment, the temperature is in the range from 300° to 900° C. The duration of the post treatment is at least 1 hour, preferably at least 4 hours. What has been stated for the reaction time applies to the upper limit of the post treatment time. Preferably the hot mixture is cooled to room temperature in an atmosphere containing oxygen.

Preferred lower limits of the post treatment temperature are at least 300° C., in particular 400° C., and preferred upper limit is 750° C., better 600° C., in particular 550° C., and still better 500° C. The possible post reaction should be carried out in air, pure oxygen or in a gas mixture such as $O_2/Ar$ or $O_2/N_2$. Commercially available crucibles or boats of inert materials such as, for example, aluminum oxide, zirconium, platinum and iridium may be used as reaction vessels. Suitable sources of heat are commercially available furnaces such as, for example, chamber, muffle or tubular furnaces.

A further process for preparing the superconducting substances is to mix salts of the said metals in the presence of an aqueous phase, evaporate down the water-containing salt mixture and heat at temperatures of at least 700° C. At least one of the salts used should be water-soluble and the salts should decompose to form oxides in the specified temperature range. The same applies in relation to the reaction time as when the oxides are used.

The salt mixture to be evaporated down can be prepared by dissolving metal oxides in nitric acid and fuming off the nitric acid.

Provided water-soluble salts are used, the metal hydroxides or at least on metal hydroxide can also be precipitated by adding a base, for example tetramethylammonium hydroxide. In this manner it is possible to achieve a particularly thorough mixing of the initial products. The precipitated hydroxides form, together with the undissolved constituent, the "insoluble constituent". This may be separated off, dried and then annealed as specified above. Preferably, no low-volatility cations are entrained by the base used and the salts used are derived from readily volatile acids. These are acids whose boiling point is below 150° C.

In this development of the process according to the invention, the atomic ratio of the metal salts used again corresponds to the required atomic ratio of the final product. The oxidic products prepared from the salts can also be thermally post treated as described above.

In the case of copper-rich formulations, crystals of $Cu_2O$ (red) and CuO (needles) can be removed under the microscope from the black crystalline substance according to the invention after melting, cooling and comminuting. A black crystalline substance is left.

If a Bi:(Sr+Ca):Cu atomic ratio of 2:2:1 is maintained during the preparation, pure black crystals of the composition $Bi_4(Sr,Ca)_4Cu_2O_x$ can be obtained whose transition temperature $T_c$ for the superconductivity is at least 60–85 K, generally 70–85 K. In this connection, Ca:Sr atomic ratios of 3:1 to 1:3, in particular 1.4:3–1.8:3 and particularly preferred, of about 1.6:3 are preferred. In superconducting crystals, the index for the oxygen content (x) is about between 12 and 14.

It has now been found that this compound has the lattice constants $a=5.39 \times 10^{-8}$ cm, $b=5.39 \times 10^{-8}$ cm and $c=24.53 \times 10^{-8}$ cm. This compound can be prepared from the required metal oxides, it being necessary to maintain the atomic ratios of the compound. It has further been found that the compound probably also contains pentavalent bismuth.

If the atomic ratio of the formulation is changed slightly, compound with identical lattice constants and somewhat different composition is obtained. Use may be made, in particular, of formulations having a Cu:Bi atomic ratio of 1:1.9–1:2.1, a (Ca+Sr):Cu atomic ratio of 1.9:1–2.1:1, a (Ca+Sr):Bi atomic ratio of 0.9:1–1.1:1 and a Ca:Sr atomic ratio of 9:1–1:9, in particular 3:1–1:3, preferably 1:1–1:3.

It has further been found that, if the corresponding oxide ratios are maintained, a black crystalline substance of the overall composition $Bi_4(Ca,Sr)_6Cu_4O \approx_{20}$ can be produced which also has a high transition temperature, it may also be obtained from the melt with subsequent thermal treatment with $O_2$. The crystalline substance so prepared is composed almost exclusively of a principal phase which crystallizes in the orthorhombic system and has the specified composition. Its transition temperature $T_c$ is at least 70 K. The lattice constants of the compound which crystallizes in the orthorhombic system are $a=5.395 \times 10^{-8}$ cm, $b=5.393 \times 10^{-8}$ cm and $c=30.628 \times 10^{-8}$ cm.

A paper entitled "Superconductivity in the Very High $T_c$ Bi—Ca—Sr—Cu—O System:Phase identification" by the authors R. M. Hazen, C. T. Prewitt, R. J. Angel, N. L. Ross, L. W. Finger and C. G. Hadidiacos, D. R. Veblen and P. J.

Heaney, P. H. Hor, R. L. Meng, Y. Y. Sun, Y. O. Wang, Y. Y. Xue, Z. J. Huang, L. Gao, J. Bechtold and C. W. Chu, Phys. Rev. Lett. 60 (1988) p. 1174 revealed superconducting phase whose composition is close to $Bi_2Ca_1Sr_2Cu_2O_9$ and for which an A-centered orthorhombic unit cell is specified having the dimensions $5.41 \times 5.44 \times 30.78 \times 10^{-8}$ cm.

It has now been found that pure crystals with a somewhat higher transition temperature in which the Ca/Sr atomic ratio is 1:3.5 to 1:6.28, in particular 1:4.5 to 1:5.75, preferably 1:5, can be prepared from an initial mixture with somewhat higher Sr/Ca ratio. Reaction temperatures not exceeding 850° C., slow cooling and post annealing at 700° C. are beneficial for the formation of the compound. Small excesses of CuO and also a higher Sr/Ca ratio are furthermore beneficial.

If the atomic ratios of the formulation are changed slightly, a compound with the lattice constants specified above and a somewhat different composition is again obtained. In particular, formulations having a Cu:Bi atomic ratio of 1:0.9–1.1:1, a (Ca+Sr):Cu atomic ratio of 3:1.9–3:2.1, a (Ca+Sr):Bi atomic ratio of 3:1.9–3:2.1 and a Ca:Sr atomic ratio of 1:1–1:9, in particular 1:3.5–1:6.28 may be used.

As an X-ray structural analysis has shown, the strontium-richer compound just mentioned is made up of layers which are arranged in parallel, which each alternate with one another and which are composed of a) $[Bi_2O_4]^{2+}$ and b) $[(Ca,Sr)_3Cu_2O_6]^{2-}$ with a Perowskite structure in which, in the layer, two planes of $[CuO_6]$ octahedra which join each other at the corners are present and, in the planes of oxygen atoms which are situated above and below in parallel with each of the two $[CuO_{4/2}]$ planes, the alkaline earth atoms are so arranged that they are each situated at the center of a smallest square composed of 4 oxygen atoms, and the two planes of $[CuO_6]$ octahedra have a layer of (Ca,Sr)O in common.

The oxygen positions between the two octahedral layers are (depending on the conditions of preparation of the superconductor), not occupied or only partially occupied. Prolonged heating at 900° C. results in loss of oxygen, while prolonged heating at 400° C. in an oxygen atmosphere results in a partial filling of said oxygen positions. The oxygen occupation in the $[Bi_2O_4]^{2+}$ layers is also altered by the thermal treatment. Up to two O atoms can be removed for each $Bi_2O_4$. Bismuth is then trivalent. At the same time the color of the crystals changes from black to brown. A high oxygen content (black mass) which can be established ideally at approx. −600° C. is beneficial.

The X-ray structural analysis carried out on a single crystal having the Ca:Sr atomic ratio of 1:4 has revealed that only strontium atoms are present in the outer (Ca,Sr)O planes of the layer containing copper. On the other hand, the Ca/Sr atomic ratio in the inner (Ca,Sr)O plane of the layer containing copper is 1:1. Depending on the Ca/Sr ratio used in the formulation, this ratio may be 0.7:1–2.1:1, in particular 0.8:1 to 1.2:1. The structural arrangement of this compound is shown in FIG. 1.

In addition to the compound just described and having a Perowskite structure in which, in the layer containing copper, 2 planes of $[CuO_6]$ octahedra which are joined to each other at the corners are present, and to the compound $Bi_4(Ca,Sr)_4Cu_2O_x$ having a Perowskite structure in which, in the layer containing copper, only one plane of $[CuO_6]$ octahedra joined to each other at the corners is present, compounds exist in which the layer containing Cu is made up of more than 2 planes of $[CuO_6]$ octahedra which join each other at the corners.

Using the generally specified processes, it is possible to prepare black superconducting compounds which crystallize in the orthorhombic system and have a transition temperature $T_c$ of at least 70 K and a content of Bi, Ca, Sr and Cu, and which have an overall composition of $Bi_4(Ca,Sr)_{4+2n}Cu_{2+2n}O$ about 16+4n, where n=2, 3, 4 or 5. In these compounds, the Ca/Sr atomic ratio is 1:9 to 9:1. The lattice constants of the compounds are $a=5.39 \times 10^{-8}$ cm, $b=5.39 \times 10^{-8}$ cm and $c=(24.5+n \times 6.1) \times 10^{-8}$ cm.

X-Ray structural analyses indicate that the specified compounds are made up of layers which are arranged in parallel, which each alternate with one another and which are composed of a) $[Bi_2O_4]^{2+}$ and b) $[(Ca,Sr)_{2+n}Cu_{1+n}O_{4+2n}]^{-2}$ having a Perowskite structure in which, in this layer, 1+n planes of $[CuO_6]$ octahedra which are joined to each other at the corners are present and the alkaline earth atoms in the 2+n planes of the oxygen positions, which are parallel to, but not in, the $[CuO_{4/2}]$ planes are so arranged that they are each situated at the center of a smallest square composed of 4 oxygen atoms and the planes of $[CuO_6]$ octahedra are joined by n common layers of (Ca,Sr)O.

Here, too, the oxygen positions between the two layers of octahedra, ie. in the (Ca,Sr)O plane are not occupied or only partially occupied. A corresponding remark applies to the $[Bi_2O_4]^{2+}$ layers. The degree of occupation also depends on the thermal treatment of the crystalline substance first produced and the reaction gas used. A post-treatment as disclosed on page 6 expedient.

The Sr/Ca atomic ratio in the two outer (Ca,Sr)O planes of the layer containing copper is at least 10. These planes are therefore very strontium-rich. On the other hand, the Ca/Sr atomic ratio in the n inner (Ca,Sr)O planes of the layer containing copper depends substantially on the initial Ca/Sr ratio and may therefore be 1:10 to 10:1, in particular 1:3 to 3:1, preferably 1:1. The Ca/Sr ratio in all n inner (Ca, Sr)O planes is probably the same.

Surprisingly, superconducting substances can be obtained in the process according to the invention from laboratory chemicals having a purity of only about 99.5%.

If the atomic ratios of the formulation are changed slightly for the three-layer compound (n=2), a substance is again obtained which has a very high proportion of the compound with the specified layer structure and the specified lattice constants, but somewhat different composition. For example, formulations having a Cu:Bi atomic ratio of 3:1.9–3:2.1, a (Ca+Sr):Cu atomic ratio of 8:5.8–8:6.2, a (Ca+Sr):Bi atomic ratio of 2.1:1–1.9:1 and a Ca:Sr atomic ratio of 1:1–1:5, in particular 1:1.9–1:2.1 may be used.

The superconducting substances obtained can be used in power engineering (for cables and wires, transformers, and energy storage devices in the form of coils with current flowing through them), in magnetic technology (for example, nuclear spin tomographs and to produce holding magnets for suspension railways), in computer technology (thin films, connections on printed circuit boards, Josephson switching devices) and for electronic components (detectors, antennas, transistors, electronic sensors, for example SQUIDs, galvanometers, modulators, bolometers and SLUGs). The use of superconduction in metrology is dealt with in a paper "Die Anwendung der Supraleitung in der Meßtechnik" by Prof. F. Baumann, Karlsruhe, published in series of papers by the VDI-Bildungswerk (1976).

It has further been found that several measures are advantageous for raising the proportion of a phase having $T_c \approx 110$ K, A beneficial requirement is that the overall composition of the reaction mixture in the triangular coordinate system (ignoring the oxygen component) lies between four points ABCD which define a parallelogram, where A=$Bi_{0.19}E_{0.35}Cu_{0.46}$,
B=$Bi_{0.14}E_{0.4}Cu_{0.46}$,
C=$Bi_{0.3}E_{0.38}Cu_{0.32}$,
D=$Bi_{0.25}E_{0.43}Cu_{0.32}$ and E denotes the sum of the alkaline earths Ca+Sr. The calcium/strontium atomic ratio is 0.85:1–1.2:1, in particular 0.95:1–1.1:1. Preferably it is 1:1. Preferably, the overall composition lies between the corner points $Bi_{0.2}E_{0.4}Cu_{0.4}$ and $Bi_{0.25}E_{0.4}Cu_{0.35}$ which define a straight line intersection. With a Ca/Sr atomic ratio of 1:1, this corresponds to the corner points $BiSrCaCu_2O_x$ and $BiSr_{0.8}Ca_{0.8}Cu_{1.4}O_x$.

It is furthermore advantageous to carry out the sintering process at as high temperatures as possible. However, in this process, the formulation should not melt. The duration of the sintering process is advantageously at least 50 hours, preferably at least 80 hours. It is beneficial to sinter in an oxygen-containing atmosphere, in particular air. If sintering is carried out in pure nitrogen, the formulation begins to melt about 40 K earlier.

A further advantageous measure is to cool down the formulation after sintering to temperatures of 550°–650° C., preferably 580°–620°, in particular 590°–610° C., to leave it for some time at this temperature, to heat it up again to the sintering temperature and to repeat this process at least 2×. This process can be repeated 2–20 times. The proportion of the superconducting phase then decreases again. It is preferable to repeat the cycle 2–6 times, in particular 2–3 times. The time for cooling from the sintering temperature to 550°–650° C., holding in the range 550°–650° C. and heating up again to the sintering temperature should be at least 30 minutes in each case, or better, at least 45 minutes. For the time of cooling to 550°–650° C. and holding at 550°–650° C., a time is preferred of at least one hour, in particular 1–3 hours, in each case. A further increase in these times appears to offer no more advantages.

The invention is explained in more detail by the examples.

EXAMPLE 1

1 mol of $Bi_2O_3$, 2 mol of SrO, 2 mol of CaO and 2 mol of CuO are comminuted in an agate mortar, very intimately mixed and transferred to an $Al_2O_3$ boat.

The specimen is rapidly heated in a suitable laboratory furnace to 950° C., and the specimen melts Specimens quenched directly from 950° C. to room temperature exhibit an X-ray diffraction diagram according to Table 1 and also do not exhibit any superconduction.

If the specimen is cooled from 950° C. to 700° C. and kept at this temperature for one hour and then rapidly cooled to room temperature, the fragments of the melt cake so obtained exhibit a critical temperature of $T_c$=70 K with measurements in a SQUID magnetometer.

The X-ray diffraction diagram of this specimen exhibits the appearance of a further crystalline phase (Table 2).

If the specimen is cooled from 700° C. to 500° C. and again annealed there for one hour, the powder diagram exhibits the phase which appeared at 700° C. as the main product (Table 3). This specimen also exhibits a critical temperature of approx. 70 K (SQUID magnetometer).

EXAMPLE 2

3 mol of $SrCO_3$, 1.5 mol of $Bi_2O_3$, 3 mol of $CaCO_3$ and 6 mol of CuO are comminuted in an agate mortar, mixed thoroughly and transferred to an $Al_2O_3$ crucible.

The specimen is heated in air to 800° C. in 6 hours in a suitable laboratory furnace and kept there for 6 hours. The specimen is then cooled to 400° C. in 2 hours, kept at this temperature for a further 3 hours, then cooled to 100° C. in 2 hours and removed from the furnace.

The black material so prepared exhibits a transition temperature of $T_c$=75 K with measurements in a SQUID magnetometer (FIG. 2).

EXAMPLE 3

0.2 mol of $Bi_2O_3$, 0.6 mol of SrO, 0.2 mol of CaO and 0.6 mol of CuO are comminuted, mixed and rapidly heated to 830° C. in a corundum crucible. This temperature is maintained for 2 hours and subsequent annealing is then carried out in air at 800° C. for 3 hours. The formulation is quenched from 800° C. to room temperature by removing it from the furnace and allowing it to cool in air.

A compound is obtained of the approximate composition $Bi_4(Ca,Sr)_8Cu_6O_{20}$. The Sr/Ca atomic ratio is 4:1. The transition temperature $T_c$ is 70–82 K.

EXAMPLE 4

0.01 mol of CaO, 0.01 mol of $Bi_2O_3$, 0.01 mol of SrO and 0.01 mol of CuO are mixed in an agate mortar, comminuted and transferred to a corundum boat. The formulation is heated rapidly in air to 1000° C. in a laboratory furnace and kept at this temperature for 30 minutes. The crystalline substance melts in this process. It is then allowed to cool in the furnace to room temperature. The black stalk-like solidified melt cake is comminuted in a mortar, heated again (to 800° C. in 2 hours in an oxygen atmosphere), then kept for 3 hours at 800° C. and cooled to room temperature in 3 hours.

A subsequent measurement of the susceptibility in a SQUID magnetometer reveals a transition temperature of 77 K. The compound has the overall composition $Bi_4(Ca,Sr)_4Cu_2O\mp_{14}$.

EXAMPLE 5

0.02 mol of CaO, 0.01 mol of $Bi_2O_3$, 0.02 mol of SrO and 0.04 mol of CuO are mixed in an agate mortar, comminuted and transferred to a corundum boat. The formulation is heated in one hour to 1000° C. in air in a laboratory furnace and kept at this temperature for 30 minutes. In this process a melt is formed. Cooling is then carried out to 500° C. in 2 hours and the formulation is removed from the furnace at this temperature. A subsequent measurement of the susceptibility in a SQUID magnetometer reveals a transition temperature of about 80 K.

According to radiographic investigations, the main product is $Bi_6(Sr,Ca)_6Cu_4O\approx_{20}$.

EXAMPLE 6

2 mol of $Bi_2O_3$, 4 mol of $SrCO_3$, 4 mol of CaO and 8 mol of CuO are comminuted in an agate mortar, mixed thoroughly and transferred to an $Al_2O_3$ crucible. The specimen is rapidly heated in air to 800°–820° C., kept there for 20 hours and rapidly cooled to room temperature. The annealed powder is comminuted and treated thermally and mechanically a further two times as described above.

The black powder is then pressed into tablets under a pressure of 300 MPa (3 kbar), these are placed on MgO sheets and variously treated thermally (in air) as described below:

a) Heating to 870° C. for 3 hours
annealing at 870° C. for 80 hours
cooling to room temperature (=RT) in 2 min ("quenching")
conductivity measurement: $T_c$ (R=0)=57 K
SQUID measurement: 12% superconducting component at 4 K (measured at B=100 gauss; 1 gauss=$10^{-4}$ Wb/m$^2$)

b) Heating to 870° C. in 3 hours
annealing at 870° C. for 80 hours
cooling to 600° C. in 3 hours
quenching from 600° C. to RT (2 min)
conductivity: $T_c$ (R=0)=63 K
SQUID measurement:

c) Heating to 870° C. in 3 hours
annealing at 870° C. for 80 hours
cooling to 600° C. in 3 hours
annealing at 600° C. for 3 hours
heating to 870° C. in 3 hours
annealing at 870° C. for 3 hours
cooling to 600° C. in 3 hours
annealing at 600° C. for 3 hours
heating to 870° C. in 3 hours
annealing at 870° C. for 3 hours
cooling to 600° C. in 3 hours
annealing at 600° C. for 3 hours
cooling to RT in 3 hours
conductivity measurement: $T_c$ (R=0)=107 K
SQUID measurement: 30% superconducting component at 4 K (measured at 100 gauss)

d) Heating to 864° C. in 3 hours
annealing at 864° C. for 50 hours
following temperature cycle run six times:
cooling to 600° C. in 1 hour
annealing at 600° C. for 1 hour
heating to 864° C. in 1 hour
annealing at 864° C. for 1 hour
then:
cooling to 600° C. in 3 hours
annealing at 600° C. for 3 hours
cooling to RT in 3 hours
conductivity measurement: $T_c$ (R=0)=102 K
SQUID measurement: 25% superconducting component at 4 K (measured at B=100 gauss)

e) Heating to 870° C. in 3 hours
annealing at 870° C. for 80 hours
following temperature cycle run twelve times:
cooling to 600° C. in 3 hours
annealing at 600° C. for 3 hours
heating to 870° C. in 3 hours
annealing at 870° C. for 3 hours
then:
cooling to 600° C. in 3 hours
annealing at 600° C. for 3 hours
cooling to RT in 3 hours
conductivity: $T_c$ (R=0)=105 K
SQUID measurement: 26% superconducting component at 4 K (measured at B=100 gauss)

f) Heating to 870° C. in 3 hours
annealing at 870° C. for 80 hours
following temperature cycle run three times:
cooling to 600° C. in 3 hours
annealing at 600° C. for 3 hours
heating to 870° C. in 3 hours
annealing at 870° C. for 3 hours
then:
cooling to 600° C. in 3 hours
annealing at 600° C. for 3 hours
cooling to RT in 3 hours
conductivity: $T_c$ (R=0)=98 K
SQUID measurement: 35% superconducting component at 4 K measured with 100 gauss
50% superconducting component measured with 10 gauss 1 gauss=$10^{-4}$Wb/m$^2$.

EXAMPLE 7

4.3 mol of $Bi_2O_3$, 7 mol of $SrCO_3$, 7 mol of CaO and 12 mol of CuO are comminuted in an agate mortar, mixed and transferred to an $Al_2O_3$ crucible. The specimen is rapidly heated in air to 800°–820° C., kept there for 20 hours, rapidly cooled to RT and coeeinuted (agate mortar). The annealing comminuting is repeated a further two times. Then the powder is pressed into tablets under a pressure of 300 MPa (3 kbar) and treated thermally on MgO sheets as described below:

a) Heating to 866° C. in 3 hours
annealing at 866° C. for 65 hours
following temperature cycle traversed six times
cooling to 600° C. in 3 hours
annealing at 600° C. for 3 hours
heating to 866° C. in 3 hours
annealing at 866° C. for 3 hours
then:
cooling to 600° C. for 3 hours
annealing at 600° C. for 3 hours
cooling to RT in 3 hours
$T_c$ (R=0)=66 K b) Heating to 866° C. in 3 hours
annealing at 866° C. for 53 hours
following temperature cycle run six times:
cooling to 600° C. in 3 hours
annealing at 600° C. for 3 hours
heating to 866° C. in 3 hours
annealing at 866° C. for 3 hours
then:
cooling to 600° C. for 3 hours
annealing at 600° C. for 3 hours
cooling to RT in 3 hours
$T_c$ (R=0)=95 K
24% superconducting component at 4 K (measured with B=100 gauss)

c) Heating to 868° C. in 3 hours
annealing at 868° C. for 34 hours
following temperature cycle run nine times:
cooling to 600° C. in 3 hours
annealing at 600° C. for 3 hours
heating to 868° C. in 3 hours
annealing at 868° C. for 3 hours
then:
cooling to 600° C. for 3 hours
annealing at 600° C. for 3 hours
cooling to RT in 3 hours
$T_c$ (R=0)=60 K

EXAMPLE 8

2 mol of $Bi_2O_3$, 4 mol of $SrCO_3$, 4 mol of CaO and 12 mol of CuO are processed into tablets by the method specified in Example 6. These are thermally treated in various rays (in air):

a) Heating to 863° C. for 3 hours annealing at 863° C. for 50 hours
following cycle traversed six times:
cooling to 600° C. in 1 hour
annealing at 600° C. for 1 hour
heating to 863° C. in 1 hour
annealing at 863° C. for 1 hour
then:
cooling to 600° C. in 1 hour
annealing at 600° C. for 1 hour
cooling to RT in 1 hour
$T_c$ (R=0)=66 K b) Heating to 868° C. in 3 hours
annealing at 868° C. for 34 hours
following cycle traversed eight times:
cooling to 600° C. in 1 hour
annealing at 600° C. for 1 hour
heating to 868° C. in 1 hour
annealing at 868° C. for 1 hour
then:
cooling to 600° C. in 1 hour
annealing at 600° C. for 1 hour
cooling to RT in 1 hour
$T_c$ (R=0)=64 K

EXAMPLE 9

1 mol of $Bi_2O_3$, 2 mol of $SrCO_3$, 2 mol of CaO and 3 mol of CuO are processed into tablets by the method specified in Example 6. These are thermally treated in the following way (in air):

Heating to 870° C. in 3 hours
annealing at 870° C. for 80 hours
following cycle traversed twice
cooling to 600° C. in 3 hours
annealing at 600° C. for 3 hours
heating to 870° C. in 3 hours
annealing at 870° C. for 3 hours
 then:
cooling to 600° C. in 3 hours
annealing at 600° C. for 3 hours
cooling to RT in 3 hours
$T_c$ (R=0)=65 K
20% superconducting component at 4 K (measured at 100 gauss)

TABLE 1

| NO | 2 THETA | D | INTEG.I (%) |
|---|---|---|---|
| 1 | 7.125 | 12.4060 | 6.6 |
| 2 | 16.709 | 5.3057 | 0.5 |
| 3 | 21.674 | 4.1002 | 27.7 |
| 4 | 23.487 | 3.7877 | 0.7 |
| 5 | 25.718 | 3.4640 | 20.7 |
| 6 | 29.222 | 3.0560 | 100.0 |
| 7 | 29.600 | 3.0179 | 26.9 |
| 8 | 30.455 | 2.9351 | 3.9 |
| 9 | 31.937 | 2.8022 | 5.2 |
| 10 | 33.154 | 2.7021 | 14.8 |
| 11 | 34.884 | 2.5719 | 7.3 |
| 12 | 35.620 | 2.5204 | 0.6 |
| 13 | 36.532 | 2.4596 | 8.5 |
| 14 | 37.193 | 2.4173 | 6.2 |
| 15 | 37.854 | 2.3767 | 1.0 |
| 16 | 40.085 | 2.2494 | 1.1 |
| 17 | 41.047 | 2.1989 | 0.6 |
| 18 | 41.962 | 2.1530 | 15.4 |
| 19 | 44.368 | 2.0417 | 2.7 |

TABLE 1-continued

| NO | 2 THETA | D | INTEG.I (%) |
|---|---|---|---|
| 20 | 44.706 | 2.0270 | 8.9 |
| 21 | 50.234 | 1.8162 | 0.9 |
| 22 | 52.027 | 1.7577 | 16.8 |
| 23 | 53.693 | 1.7070 | 2.2 |
| 24 | 54.214 | 1.6919 | 1.3 |
| 25 | 54.972 | 1.6703 | 1.3 |
| 26 | 57.077 | 1.6136 | 9.0 |

TABLE 2

| NO | 2 THETA | D | INTEG.I (%) |
|---|---|---|---|
| 1 | 4.122 | 21.4351 | 3.6 |
| 2 | 4.302 | 20.5386 | 2.3 |
| 3 | 5.698 | 15.5105 | 1.6 |
| 4 | 7.107 | 12.4381 | 4.3 |
| 5 | 7.682 | 11.5074 | 1.6 |
| 6 | 21.611 | 4.1121 | 29.5 |
| 7 | 22.809 | 3.8986 | 21.9 |
| 8 | 24.713 | 3.6025 | 8.3 |
| 9 | 25.713 | 3.4646 | 26.0 |
| 10 | 26.101 | 3.4140 | 1.5 |
| 11 | 27.278 | 3.2693 | 35.6 |
| 12 | 28.947 | 3.0844 | 100.0 |
| 13 | 29.637 | 3.0142 | 47.5 |
| 14 | 30.149 | 2.9642 | 2.1 |
| 15 | 30.676 | 2.9144 | 45.5 |
| 16 | 31.950 | 2.8011 | 17.4 |
| 17 | 33.057 | 2.7098 | 84.9 |
| 18 | 34.875 | 2.5728 | 38.7 |
| 19 | 35.781 | 2.5094 | 1.3 |
| 20 | 36.497 | 2.4618 | 9.8 |
| 21 | 37.210 | 2.4183 | 12.8 |
| 22 | 39.964 | 2.2559 | 1.8 |
| 23 | 42.093 | 2.1466 | 3.9 |
| 24 | 44.719 | 2.0265 | 99.4 |
| 25 | 46.642 | 1.9473 | 3.8 |
| 26 | 47.382 | 1.9186 | 31.6 |
| 27 | 50.234 | 1.8162 | 14.1 |
| 28 | 52.881 | 1.7313 | 1.5 |
| 29 | 53.697 | 1.7069 | 4.7 |
| 30 | 54.224 | 1.6916 | 2.4 |
| 31 | 54.917 | 1.6719 | 3.6 |
| 32 | 56.343 | 1.6329 | 1.9 |
| 33 | 56.797 | 1.6209 | 3.6 |
| 34 | 57.524 | 1.6021 | 0.9 |
| 35 | 58.423 | 1.5796 | 1.6 |

TABLE 3

| NO | 2 THETA | D-space | INTEG.I (%) |
|---|---|---|---|
| 1 | 7.231 | 12.21443 | 6.1 |
| 2 | 14.363 | 6.16182 | 8.2 |
| 3 | 16.783 | 5.27810 | 8.3 |
| 4 | 19.324 | 4.58947 | 14.1 |
| 5 | 21.703 | 4.09147 | 8.5 |
| 6 | 23.570 | 3.77145 | 6.4 |
| 7 | 24.696 | 3.60198 | 6.1 |
| 8 | 25.753 | 3.45652 | 61.2 |
| 9 | 27.327 | 3.26082 | 6.2 |
| 10 | 28.700 | 3.10796 | 10.3 |
| 11 | 29.002 | 3.07624 | 48.6 |
| 12 | 29.675 | 3.00800 | 100.0 |
| 13 | 30.202 | 2.95671 | 9.6 |
| 14 | 30.553 | 2.92351 | 8.6 |
| 15 | 31.856 | 2.80687 | 13.6 |
| 16 | 32.057 | 2.78974 | 6.2 |
| 17 | 32.674 | 2.73843 | 6.3 |
| 18 | 32.917 | 2.71878 | 25.6 |
| 19 | 33.216 | 2.69494 | 53.0 |
| 20 | 34.491 | 2.59820 | 9.7 |

TABLE 3-continued

| NO | 2 THETA | D-space | INTEG.I (%) |
|---|---|---|---|
| 21 | 34.737 | 2.58039 | 8.7 |
| 22 | 35.681 | 2.51426 | 8.3 |
| 23 | 35.990 | 2.49334 | 7.9 |
| 24 | 36.376 | 2.46778 | 10.6 |
| 25 | 37.231 | 2.41303 | 7.2 |
| 26 | 42.002 | 2.14932 | 13.2 |
| 27 | 44.645 | 2.02803 | 14.2 |
| 28 | 47.340 | 1.91868 | 9.7 |
| 29 | 47.662 | 1.90646 | 19.7 |
| 30 | 51.393 | 1.77645 | 7.2 |
| 31 | 51.789 | 1.76380 | 12.6 |
| 32 | 52.047 | 1.75566 | 7.2 |
| 33 | 53.148 | 1.72185 | 6.8 |
| 34 | 54.943 | 1.66978 | 8.5 |
| 35 | 56.669 | 1.62296 | 8.3 |
| 36 | 56.861 | 1.61791 | 6.5 |
| 37 | 57.072 | 1.61243 | 10.5 |
| 38 | 57.408 | 1.60379 | 6.0 |
| 39 | 57.713 | 1.59604 | 6.6 |
| 40 | 60.004 | 1.54048 | 8.8 |

We claim:

1. A process for preparing a superconducting compound having essentially the overall composition $$Bi_4(Ca,Sr)_{4+2n}Cu_{2+2n}O_x$$

where n is 2 and x, which varies with the conditions of said process, is greater than 16 but not greater than 16+4n, said process comprising:

preparing an initial mixture containing the oxides or oxide precursors of bismuth, calcium, strontium, and copper in the atomic ratios necessary to form said superconducting compound, heating the resulting mixture to a temperature within the range of between 700° C. and 900° C. so that the mixture is not melted or is only partially melted, and keeping the mixture in this temperature range for at least 100 hours, cooling the mixture, and obtaining a superconducting compound having a principal phase which crystallizes in the orthorhombic system and a transition temperature $T_c$ for the superconductivity of at least 70K.

2. A process for preparing a superconducting substance having essentially the overall composition $$Bi_a(Sr, Ca)_b Cu_6 O_x$$

wherein a=3 to 12, b=6 to 12, and x varies with the conditions of the process, with an atomic ratio Sr/Ca of 1:9 to 9:1, an atomic ratio Bi:(Sr+Ca) of 0.3 to 1.3, said superconducting substance having a principal phase which crystallizes in the orthorhombic system and a transition temperature $T_c$ for the superconductivity of at least 70 K, said process comprising:

preparing an initial mixture containing the oxides or oxide precursors of bismuth, calcium, strontium, and copper in the atomic ratios necessary to form said superconducting substance, heating the resulting mixture to a temperature in the range of between 700° C. and 900° C. so that the mixture is not melted or is only partially melted, and keeping the mixture in this temperature range for at least 100 hours, and cooling the mixture.

3. The process as claimed in claim 2, wherein salts of bismuth, calcium, strontium and copper, of which at least one is water-soluble, are mixed in the presence of an aqueous phase, the mixture is evaporated down and heated.

4. The process as claimed in claim 3, wherein at least one metal hydroxide is precipitated by adding a base to the mixture of the salts in the presence of an aqueous phase, and the insoluble component is separated off, dried and heated.

5. The process as claimed in claim 3, wherein the salts used are derived from readily volatile acids.

6. The process as claimed in claim 2, wherein the initial mixture is heated to a temperature of at least 800° C., but so that the mixture is not melted, in an atmosphere containing oxygen.

7. The process as claimed in claim 2, wherein the heating is carried out in an oxygen-containing atmosphere.

8. The process as claimed in claim 2, wherein, after the heating process, the resulting product is subjected to a post treatment by heating in the temperature range of 300° to 750° C.

9. The process as claimed in claim 8, wherein said post treatment is carried out in the temperature range of 400° to 600° C.

10. The process as claimed in claim 8, wherein the post treatment is carried out in an oxygen-containing gas.

11. The process as claimed in claim 2, wherein the mixture is annealed after said heating step.

12. The process as claimed in claim 11, wherein the annealed mixture is comminuted, mixed, and again heated in a temperature range of 300° to 900° C.

13. The process as claimed in claim 2, wherein the heating or the cooling, or both the heating and cooling, are carried out in an oxygen-containing atmosphere.

14. The process as claimed in claim 2, wherein the mixture is heated for 120 hours.

15. The process as claimed in claim 2, wherein said superconducting substance is a compound and has essentially the overall composition $$Bi_4(Ca,Sr)_{4+2n}Cu_{2+2n}O_x$$

where n is 2, 3, 4, or 5, and x, which varies with the conditions of said process, is greater than 16 but not greater than 16+4n.

16. The process as claimed in claim 15, wherein the initial mixture is heated to a temperature of at least 800° C., so that the mixture is not melted in an atmosphere containing oxygen.

17. The process as claimed in claim 15, wherein said superconducting substance is a compound having lattice constants a=5.41×10⁻⁸ cm, b=5.47×10⁻⁸ cm, and c=(24.5+n×6.3)×10⁻⁸ cm, where n is as defined in claim 15.

18. The process as claimed in claim 15, wherein the heating is carried out in an oxygen-containing atmosphere.

* * * * *